United States Patent
James

(10) Patent No.: US 9,083,260 B2
(45) Date of Patent: Jul. 14, 2015

(54) INVERTER CONTROLLER AND METHOD OF CONTROLLING AN INVERTER

(71) Applicant: Control Techniques Limited, Newtown (GB)

(72) Inventor: Gareth Christopher James, Oswestry (GB)

(73) Assignee: CONTROL TECHNIQUES LIMITED, Newtown (GB)

( * ) Notice: Subject to any disclaimer, the term of this patent is extended or adjusted under 35 U.S.C. 154(b) by 223 days.

(21) Appl. No.: 13/898,899

(22) Filed: May 21, 2013

(65) Prior Publication Data

US 2014/0346989 A1     Nov. 27, 2014

(51) Int. Cl.
*H02M 7/44*     (2006.01)

(52) U.S. Cl.
CPC ...................... *H02M 7/44* (2013.01)

(58) Field of Classification Search
CPC ........... H02M 7/02; H02M 7/04; H02M 7/42; H02M 7/44; H02M 7/54; H02M 7/66; H02M 7/68
See application file for complete search history.

(56) References Cited

U.S. PATENT DOCUMENTS

| | | |
|---|---|---|
| 5,875,414 A | 2/1999 | Tsutsumi |
| 7,023,172 B2 | 4/2006 | Katou |
| 7,515,447 B2 | 4/2009 | Ronkainen et al. |
| 8,148,929 B2 | 4/2012 | Wei et al. |
| 8,471,516 B2 | 6/2013 | Wei et al. |
| 8,736,091 B2 | 5/2014 | Wei et al. |
| 2012/0099618 A1* | 4/2012 | Nishi et al. ............... 374/152 |

FOREIGN PATENT DOCUMENTS

| | | |
|---|---|---|
| EP | 0413966 | 2/1991 |
| EP | 2184840 | 5/2010 |
| JP | 2-84011 | 3/1990 |
| JP | 3-195394 | 8/1991 |
| JP | 2000-228882 | 8/2000 |
| WO | 2006/006288 | 1/2006 |

* cited by examiner

*Primary Examiner* — Emily P Pham

(74) *Attorney, Agent, or Firm* — Harness, Dickey & Pierce, P.L.C.

(57) ABSTRACT

A method of controlling a switching frequency of an inverter, the method comprising the steps of: measuring a signal indicative of a temperature variable at a first switching frequency to determine a measured temperature variable; comparing the measured temperature variable to a first threshold; determining if the measured temperature variable is above the first threshold; if the measured temperature variable is not above the first threshold, calculating the temperature variable at a second switching frequency; if the temperature variable calculated at the second switching frequency is less than the first threshold, setting the switching frequency of the inverter to the second switching frequency.

19 Claims, 7 Drawing Sheets

_US 9,083,260 B2_

INVERTER CONTROLLER AND METHOD OF CONTROLLING AN INVERTER

FIELD

The invention relates to an inverter controller and method of controlling an inverter.

BACKGROUND OF THE INVENTION

Inverters are well known devices for providing AC power to a load such as a motor from a DC source such as rectified source.

Referring to FIG. 1, a simple inverter configuration is shown at 100 as including an insulated gate bipolar transistor (IGBT) 102, diode 104 and gate driver 106. The configuration is well known to the skilled person and not described in detail here and can include multiple diodes, IGBTs and drivers.

According to known systems the peak or absolute temperature of the device is maintained below a fail temperature for example 150° C. or a threshold temperature below that, for example 135° C. in order to avoid degraded performance or failure. One known device is the Unidrive M700 product available from Control Techniques Ltd. in which, as can be understood from FIG. 1 in conjunction with FIG. 2 temperature feedback of the case is obtained by a module such as a thermistor 108 which feeds the value to a temperature monitoring and pulse width modulation (PWM) controller 110 which receives additional measured operating conditions and control parameters to model device temperature as described below. In particular the temperature can be reduced by reducing the switching frequency of the inverter via the controller 110. The process can be further understood from FIG. 2 in which device junction-to-case temperature is derived as a function of measured operating conditions 200 including DC link voltage and device current which is fed to a power loss module 202 together with the current switching frequency from controller 204 and optionally further control parameters such as modulation depth acting effectively as a further model parameters. In conjunction with a thermal resistance model 206 a peak temperature is calculated at 208 in conjunction with the output frequency from motor control algorithm 210 to compensate for variation of power loss with time to provide a more accurate representation of peak temperature as a function of output frequency. Together with case temperature feedback 212 from thermistor 108 this is summed at 214 to obtain a temperature assessment 216 of junction-to-case temperature plus case temperature, ie absolute temperature rise which is fed to the switching frequency control. The switching frequency is fed back to the power loss module and also to the PWM controller 110 which generates appropriate gate signals 218 to control the switching frequency of the inverter. The approach prolongs the lifetime of switching devices by minimising the power loss through reduction of the switching frequency and in particular prevents the device shutting down when the fail temperature is met. However known devices do not operate at optimum performance according to this approach and can still, for example, face a reduced lifetime.

SUMMARY

The invention is set out in the claims. In particular it is recognised that variations in temperature, even though below the threshold temperature, sometimes termed "temperature ripple", can lead to premature failure of the device. By monitoring temperature ripple and controlling the switching frequency accordingly, the lifetime can thus be prolonged whilst maintaining optimum operation.

According to a first aspect there is provided a method of controlling a switching frequency of an inverter is provided, the method comprising the steps of: measuring a signal indicative of a temperature variable at a first switching frequency to determine a measured temperature variable; comparing the measured temperature variable to a first threshold; determining if the measured temperature is above the first threshold; if the measured temperature variable is not above the first threshold, calculating the temperature variable at a second switching frequency; if the temperature variable calculated at the second switching frequency is less than the first threshold, setting the switching frequency of the inverter to the second switching frequency.

Optionally, the step of comparing the measured temperature variable comprises comparing the measured temperature variable to the first threshold and a second threshold, and if the measured temperature variable is not between the first threshold and the second threshold, the method proceeds to the step of determining if the measured temperature variable is above the first threshold.

Optionally, if the measured temperature variable is between the first threshold and the second threshold, the measured temperature variable is determined again after a predetermined time.

Optionally, the predetermined time is the sample rate of a temperature variation monitor.

Optionally, the first threshold is higher than the second threshold.

Optionally, the first threshold and the second threshold are such that, if the measured temperature variable is below the second threshold, the temperature variable calculated at the second switching frequency is below the first threshold.

Optionally, if the measured temperature variable is above the first threshold, the method further comprises the step of reducing the switching frequency.

Optionally, reducing the switching frequency comprises reducing the switching frequency to the next lowest switching frequency or to the minimum switching frequency.

Optionally, if the switching frequency is at the minimum switching frequency, the step of reducing the switching frequency comprises keeping the switching frequency at the minimum switching frequency.

Optionally, the second switching frequency is higher than the first switching frequency.

Optionally, measuring a signal indicative of a temperature variable comprises measuring signal indicative of a temperature variable of the inverter or a signal indicative of a temperature variable of a component of the inverter.

Optionally, measuring a signal indicative of a temperature variable comprises measuring the component of the inverter with the greatest temperature variable.

Optionally, the temperature variable comprises a temperature ripple and/or a peak temperature.

Optionally, the step of calculating the temperature variable comprises calculating the temperature online.

According to a second aspect an inverter controller is provided and arranged to carry out the method as defined in the first aspect.

Optionally, the inverter controller further comprises a temperature variation monitor.

Optionally, the temperature variation monitor comprises a temperature calculation model.

Optionally, the temperature variation monitor comprises a temperature measuring component.

Optionally, the temperature variation monitor is arranged to measure the temperature of a plurality of inverter components.

Optionally, the temperature variation monitor comprises a temperature ripple monitor, the inverter controller being arranged to set the switching frequency in response to measured and calculated ripple temperatures.

Optionally, the temperature variation monitor comprises a peak temperature monitor, the inverter controller being arranged to set the switching frequency in response to measured and calculated peak temperatures.

According to a third aspect an inverter including the inverter controller is provided.

According to a fourth aspect a motor drive including the inverter is provided.

BRIEF DESCRIPTION OF THE DRAWINGS

Embodiments of the invention will now be described, by way of example, with reference to the drawings of which.

OVERVIEW

In overview, an inverter controller is provided which monitors temperature variation or ripple and/or peak temperature and adjusts the switching frequency of an inverter dependent on the monitored ripple and/or peak temperature. This increases the lifetime of inverters for example in applications that require a high switching frequency to limit acoustic noise but can tolerate lower switching frequencies for short periods or during unusual loads as, owing to the characteristics of the ripple temperature, these periods would be more likely to occur at low output frequencies.

DETAILED DESCRIPTION

Figure 1:
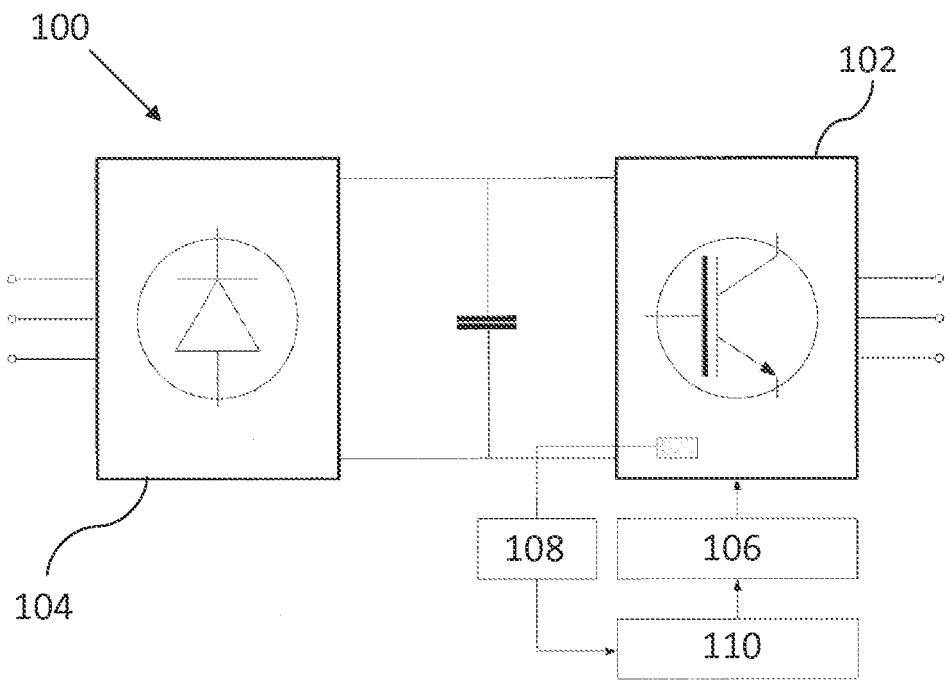
FIG. 1 is a block diagram showing a known inverter.
Figure 2:
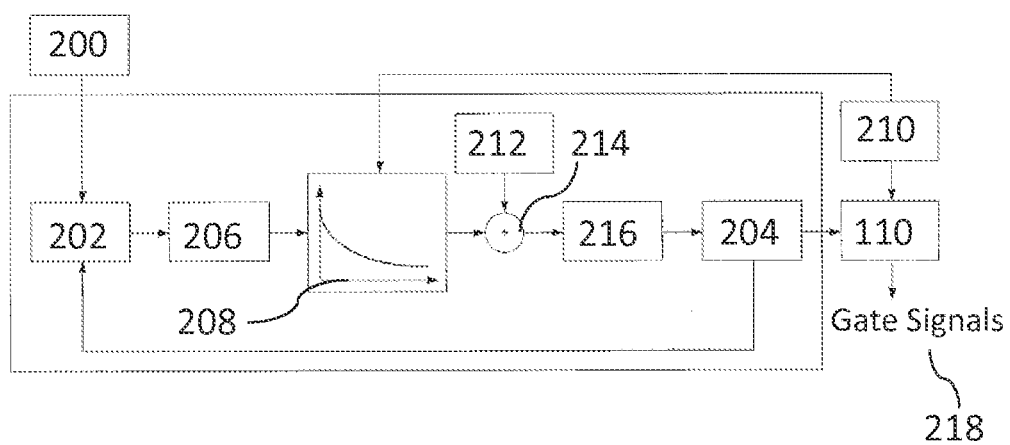
FIG. 2 shows a known approach to temperature monitoring and control.
Figure 3:
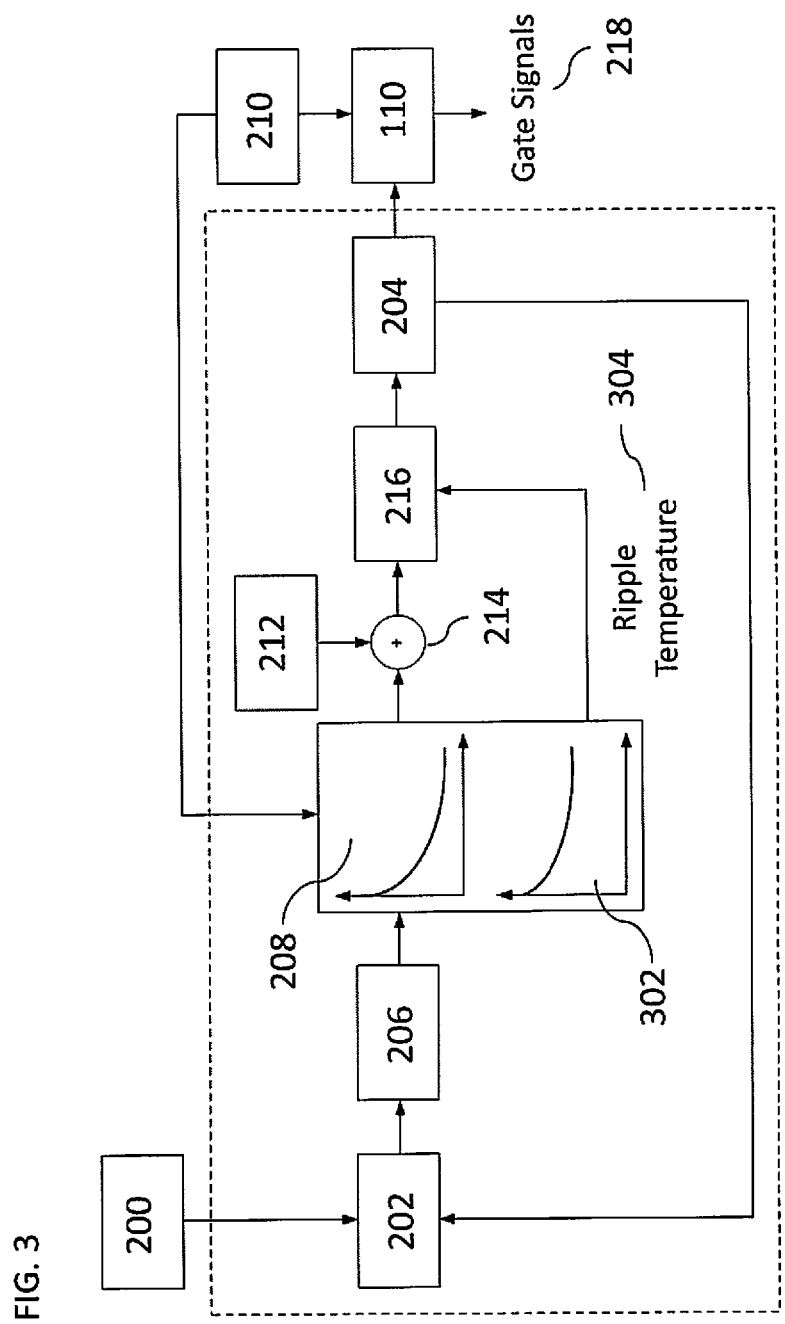
FIG. 3 shows an approach according to an embodiment of the invention in which temperature ripple is monitored.

Referring to FIG. 3 the structure is shown in more detail according to the present invention. It will be noted that the structure applies to any appropriate form of inverter. Like components with FIG. 2 are numbered similarly and are not described again, to avoid repetition. In particular, temperature ripple, or a signal indicative thereof, is computed in real time for example by direct measurement, using a thermal model or other approaches described in more detail below for comparison against an acceptable value $T_{ripple\ threshold}$. This value can be set for all inverters, preset for specific inverters or user controlled as appropriate dependent for example on the application to achieve a desired maximum value of temperature ripple.

The power loss model 202 is configured to estimate power loss within the inverter or specific components of the inverter based on the available measured operating conditions, for example the operating voltage. This is coupled with a preset or modelled value of the thermal resistance 206 to obtain a simulated peak temperature, or a signal indicative thereof, which can then be translated into peak temperature versus output frequency. This permits the device to assess whether the inverter is approaching or at a fail temperature, as in previous devices, and allows the switching frequency to be dropped accordingly to provide a fail safe mode.

Additionally, according to an embodiment of the invention, the peak temperature is converted into a ripple temperature 302 that provides a value of temperature ripple based on real time monitoring of the variation in temperature again as a function of output frequency.

The temperature ripple value 304 can then be sent by temperature assessment module 216 to the switching frequency control to control the inverter to maintain the ripple temperature below the desired value $T_{ripple\ threshold}$.

Figure 4:
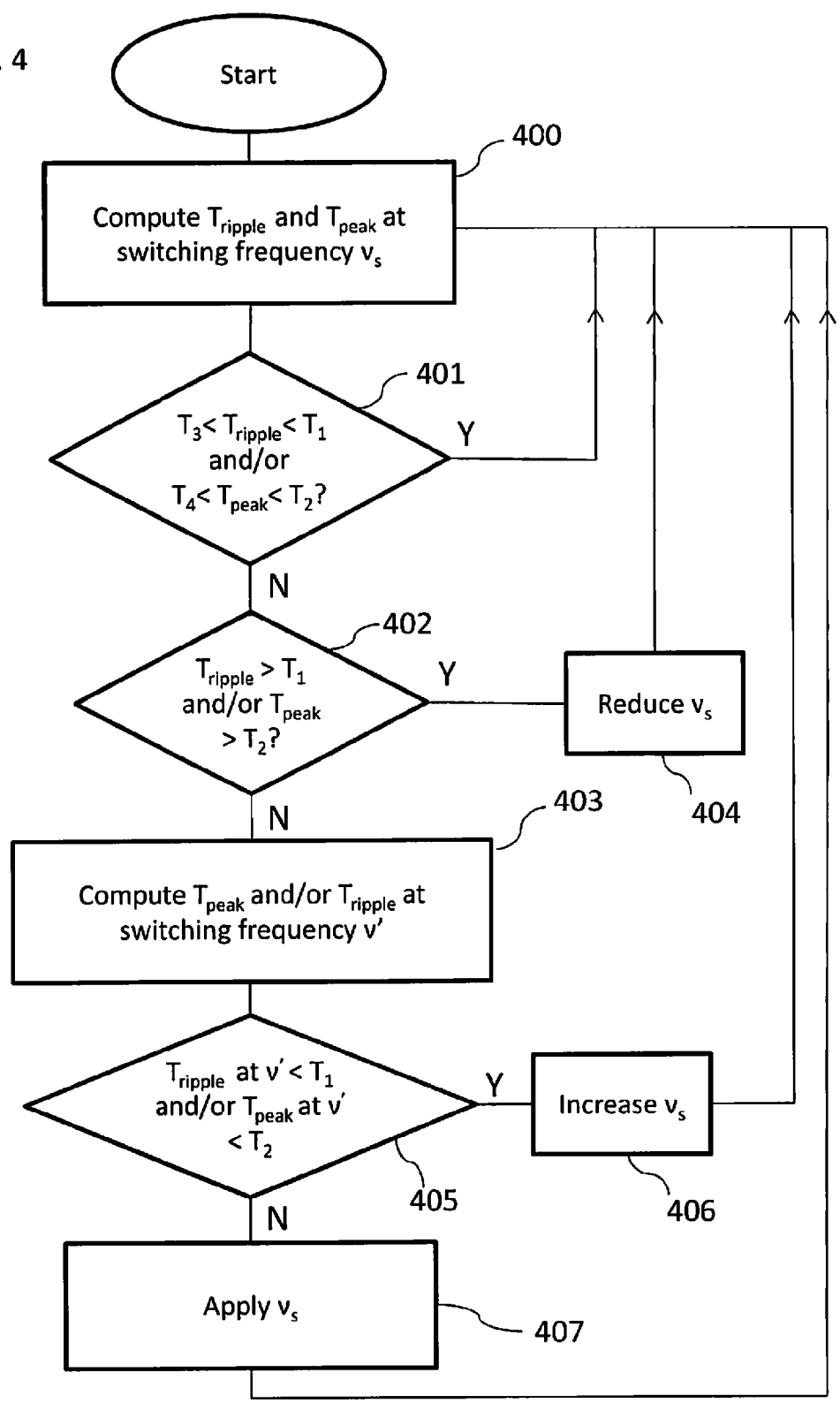
FIG. 4 is a flow diagram illustrating operation of an embodiment of the invention.

The steps adopted according to one embodiment can be further understood with reference to FIG. 4.

At step 400 the current ripple temperature and peak temperature, or signals indicative thereof, are measured in real time at the current switching frequency $v_s$. This can be assessed or monitored in any appropriate manner as discussed above. For example operating conditions of the components can be input into a model with additional parameters such as the current switching frequency to identify modelled power loss which can then be matched with the thermal resistance. Alternatively the temperatures can be directly monitored or derived in different manners. The temperature variation can then be monitored in real time to identify temperature variation or the operating conditions can be taken into account via further modelling steps to identify the temperature ripple from the known operating parameters. The temperature ripple and the peak device temperature may be calculated after a predetermined time, for example at the sample rate of the temperature monitor, which may be every 1 ms for example.

At step 401, the temperature ripple is compared with a lower temperature ripple threshold $T_3$ and the temperature ripple threshold $T_1$. The peak device temperature may also be compared with a lower peak temperature threshold $T_4$ and the peak temperature threshold $T_2$. If the temperature ripple is between $T_3$ and $T_1$, and/or the peak device temperature is between $T_4$ and $T_2$, the process loops back to step 400. If the temperature ripple is not between $T_3$ and $T_1$, and/or the peak device temperature is not between $T_4$ and $T_2$, the process proceeds to step 402. Therefore, if the temperature ripple is between $T_3$ and $T_1$, and/or the peak device temperature is between $T_4$ and $T_2$ the process cycles between steps 400 and 401 until these conditions are not met before proceeding to step 402.

At step 402 the peak device temperature and temperature ripple are compared with the peak temperature threshold $T_2$ and the temperature ripple threshold $T_1$ to ensure firstly that the device is not approaching a failure temperature, to allow the system to reduce the temperature before the fail value is reached, and secondly that operation is not compromised by temperature ripple. In particular if either or both the peak temperature or the temperature ripple exceed its respective threshold then at step 404 the frequency is reduced by one step to the next lowest value or remains at the minimum as appropriate and the process loops back to step 400. If at step 402 the peak device temperature and/or the temperature ripple do not exceed the thresholds $T_2$ and $T_1$, the process optimises the temperature ripple and operation as described as follows.

At step 403, the peak device temperature and temperature ripple at a next higher switching frequency v' is computed. For example the switching frequency may range from a maximum of 16 kHz through discrete values of 8 kHz, 4 kHz to a minimum 2 kHz.

At step 405 the peak temperature and temperature ripple value computed for the next higher frequency v' are compared with the peak temperature threshold $T_2$ and the temperature ripple threshold $T_1$. These thresholds can again be preset, operator adjusted or application dependent or assessed in any other manner. If both the peak temperature and the temperature ripple are less than their respective thresholds, then at step 406 the frequency is increased to the next higher value v' or maintained at the maximum. As a result it is possible to increase the switching frequency rather than being fixed at the current switching frequency if v' provides an acceptable level of temperature ripple.

Thus before increasing the frequency to the next higher frequency v', it is first calculated whether the peak device temperature threshold $T_2$ and temperature ripple threshold $T_1$ would be exceeded at the increased frequency v' (step 405). The switching frequency is only increased to frequency v' when these thresholds would not be exceeded. If the peak device temperature and temperature ripple at the increased frequency v' were not calculated in advance of increasing the switching frequency from v to v', an increase in the switching frequency from v to v' could cause one or both of the peak device temperature threshold $T_2$ and temperature ripple threshold $T_1$ to be exceeded and hence the system would immediately reduce the switching frequency. This may result in the system oscillating between switching frequencies v and v' which may be indicative of the peak temperature or temperature ripple being increased above the required thresholds, when the switching frequency is increased. This would negate the aim of maintaining the levels of peak temperature and/or temperature ripple below their respective thresholds. This oscillation may also increase the acoustic noise of the inverter and affect the control system of the motor operated by the inverter which would not be desirable. In order to avoid such oscillation, the lower thresholds T3 and T4 should be set low enough to ensure that, when the switching frequency is increased, the temperature ripple and/or peak device temperature do not exceed their respective thresholds T1 and T2 which would result in an immediate decrease of the switching frequency.

It will be noted that the output frequency may also be taken into account in the process described. For example at low output frequency the temperature ripple is high but at low frequency. Hence the switching frequency may be further adjusted only when temperature ripple has been high for a predetermined period, which period can be dependent on the output frequency, reducing as the output frequency increases.

If the peak temperature or temperature ripple at v' are greater than their respective thresholds then the current switching frequency is maintained at step 408. The process continues in a loop throughout operation. The process then begins again at step 400 with the switching frequency applied at step 408.

As a result, the switching frequency is kept at a maximum, in conjunction with the remaining operating conditions, if the temperature ripple and/or the peak device temperature are below their respective temperature ripple threshold $T_1$ and peak temperature threshold $T_2$, and only dropped below the maximum switching frequency to a value $v_s$ when temperature ripple exceeds $T_1$ and/or the peak device temperature exceeds $T_2$. Hence operation is optimised whilst prolonging the lifetime of the device by managing temperature ripple, whilst ensuring that the device remains below the fail temperature. Furthermore the system allows the switching frequency to be reduced or increased multiple times with one maximum temperature ripple threshold $T_1$.

Although the steps 400 to 408 in FIG. 4 relate to the measuring and calculation of both the peak device temperature and the temperature ripple, instead only the peak device temperature may be measured and calculated. Inverter applications that do not suffer from lifetime issues may tolerate high ripple temperatures. However, these applications may still require that a peak device temperature threshold is not exceeded so that the inverter continues to operate. Therefore, for these applications the peak device temperature may be measured and calculated.

In this case, at step 401 the peak device temperature is compared with the lower threshold $T_4$ and the threshold $T_2$. If the peak device temperature falls within the thresholds $T_4$ and $T_2$, the process loops back to step 400. If the peak device temperature does not fall within the thresholds $T_4$ and $T_2$, at step 402, the peak device temperature is compared with the peak device temperature threshold $T_2$. If the peak device temperature exceeds the peak device temperature threshold $T_2$, then at step 404 the frequency is reduced by one step to the next lowest value or remains at the minimum as appropriate and the process loops back to step 400. If at step 402 the peak device temperature does not exceed the threshold $T_2$, the process continues to step 403 where the peak device temperature at a next higher frequency v' is computed. At step 405 the peak device temperature computed for the higher frequency v' is compared with the peak device temperature threshold $T_2$. If the peak device temperature is less than the peak device temperature threshold $T_2$, then at step 406 the frequency is increased to the next higher value v' or maintained at the maximum. As discussed earlier, and in the same manner, it is desirable to avoid oscillation. This is achieved by calculating the peak device temperature at the higher switching frequency v' in advance of increasing the switching frequency, and only increasing the switching frequency to frequency v' when the peak device temperature threshold $T_2$ would not be exceeded.

It will be appreciated that the inverter may include multiple components such as multiple IGBTs and multiple diodes. Temperature monitoring can be applied either to the device as a whole or to individual components. Where temperature monitoring is applied to individual components for example by detecting the temperature at each component or by inputting the operating conditions of each component to the power loss model, the approach can be further optimised. For example values of $T_{ripple}$ and $T_{peak}$ can be derived from the component operating at the highest temperature allowing the steady state ripple temperature (calculated online) of the hottest or highest temperature ripple device in the inverter (IGBT or diode) to control the switching frequency in order to reduce the temperature ripple regardless of the absolute value of temperature and thereby increasing the lifetime of the inverter whilst attaining optimised operation of the inverter.

Figure 5:
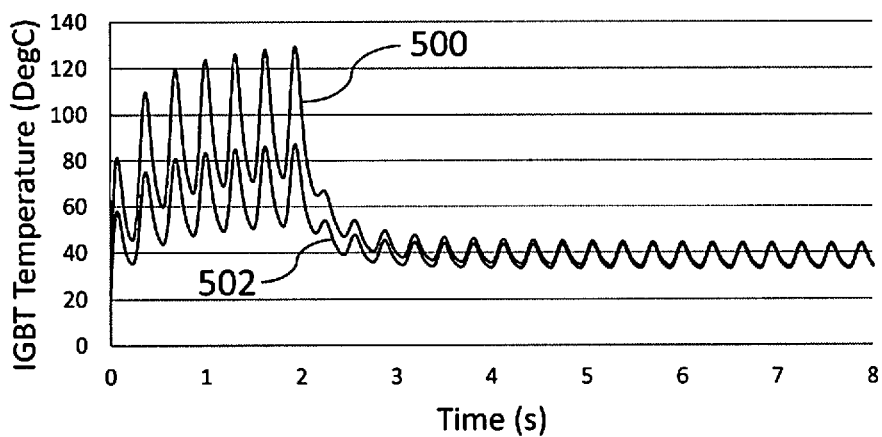
FIG. 5 is a plot of IGBT temperature against time showing improved operation for ripple detection.
Figure 6:
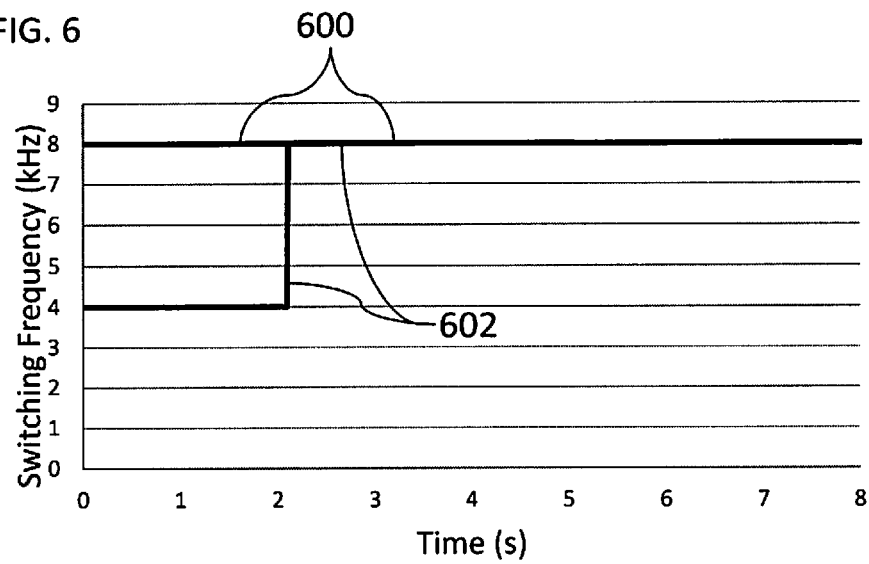
FIG. 6 shows a plot of switching frequency against time for an embodiment using ripple detection and an embodiment not using ripple detection.
Figure 7:
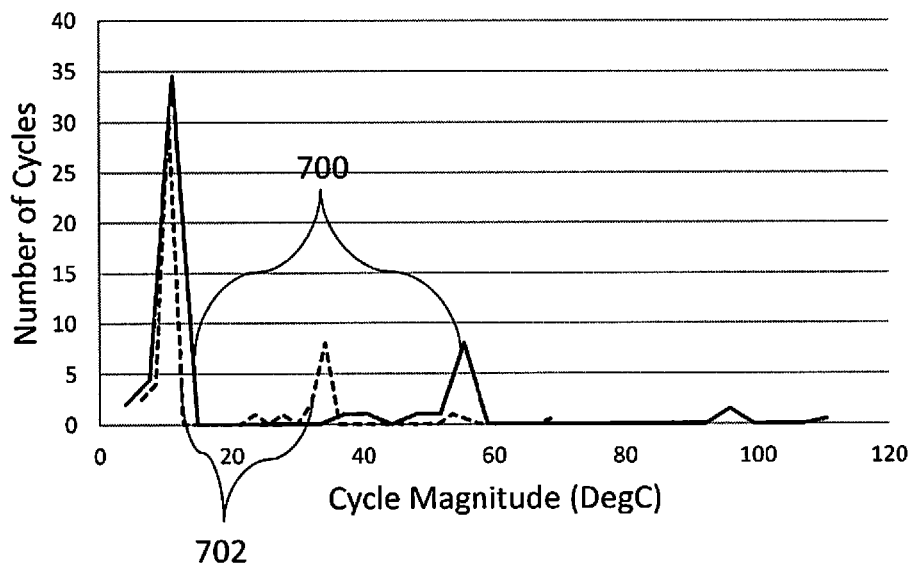
FIG. 7 is a plot of number of cycles of temperature ripple versus cycle magnitude for known approach and for the present invention.

The manner in which operation of the device is improved can be understood with reference to FIGS. 5 to 7, for example for a two second overload at a fixed output frequency of 3.2 hertz. As can be seen from FIG. 5, without ripple detection enabled significant variations in component temperature are observed (plot 500) which can lead to premature failure of the device even though the maximum operating temperature is not attained. Conversely with ripple detection enabled according to the invention (plot 502) the absolute magnitude of temperature ripple is decreased as well as the maximum operating temperature. In non overload condition (after two seconds) the operation converges on common operation.

The variation in switching frequency applied can be seen from FIG. 6 for the two second overload period. In particular the switching frequency is maintained at a fixed value throughout operation in embodiments without ripple detection as the peak temperature threshold has not been reached. However this gives rise to the significant swings in temperature that degrade lifetime as shown in FIG. 5. Conversely with ripple detection applied at 602 the device reduces switching frequency during the overload period based on modelled temperature ripple to reduce the temperature ripple as shown in FIG. 5 at 502 and hence prolong lifetime. When the temperature ripple drops to an acceptable level then the maximum switching frequency is reinstated as indicated above.

Referring to FIG. 7, the number and magnitude of temperature swings according to the prior art approach in the present invention are compared, calculated using the rain flow algorithm which will be well known to the skilled person and is not described in detail here. In particular it can be seen that the number of cycles both at small and large magnitude is greater for the embodiment where ripple detection is not instituted (plot 700) compared to a ripple detection enabled approach (plot 702).

Figure 8:
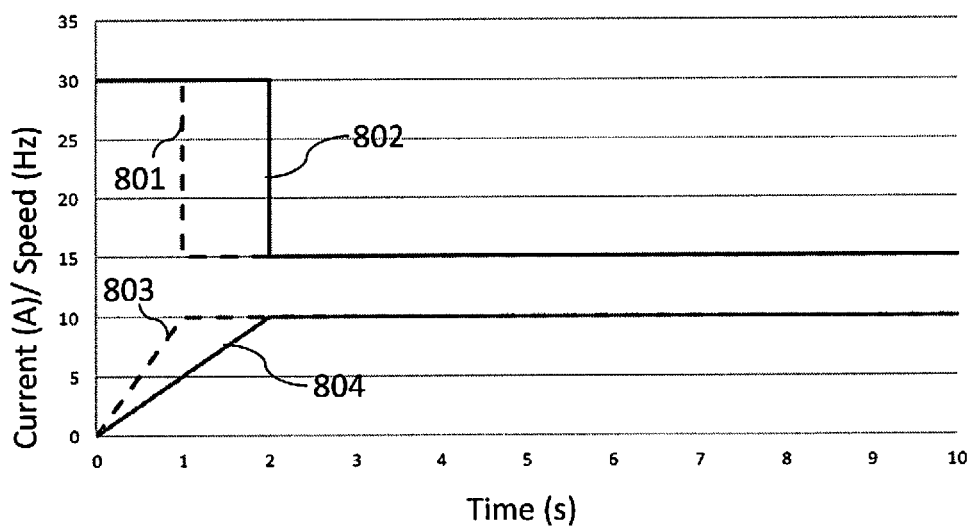
FIG. 8 shows a plot of motor current magnitude and motor frequency as experienced by an inverter during an acceleration of a motor.

The temperature ripple is only typically constant when the operating conditions of the inverter are constant. Systems may be dynamic and therefore continuously changing, and more than one variable may influence the ripple temperature. If any one of these variables were to change then the ripple temperature may also change. Two example variables, motor current magnitude and motor frequency, are shown in FIG. 8. The plot of FIG. 8 shows the motor current magnitude 802 and the motor frequency 804 as experienced by an inverter during an acceleration of a motor. For motor current magnitude 802 and motor frequency 804, a peak motor frequency is reached after 2 seconds, for example. Motor current magnitude and motor frequency as experienced by the inverter during a faster acceleration of the motor are shown in FIG. 8 by labels 801 and 803 respectively. For motor current magnitude 801 and motor frequency 803, the peak motor frequency is reached after 1 second, for example.

Figure 9:
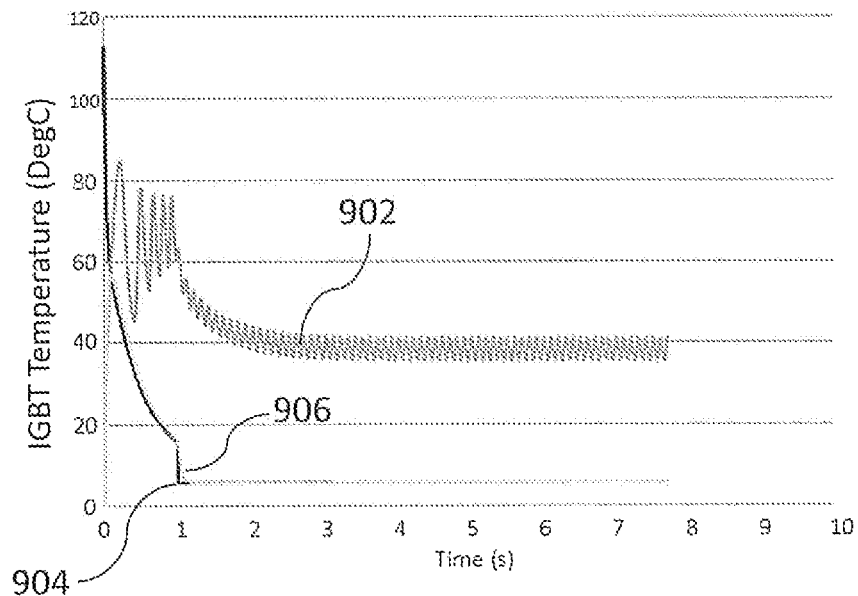
FIG. 9 shows a plot of IGBT temperature vs. time during an acceleration of the motor.
Figure 10:
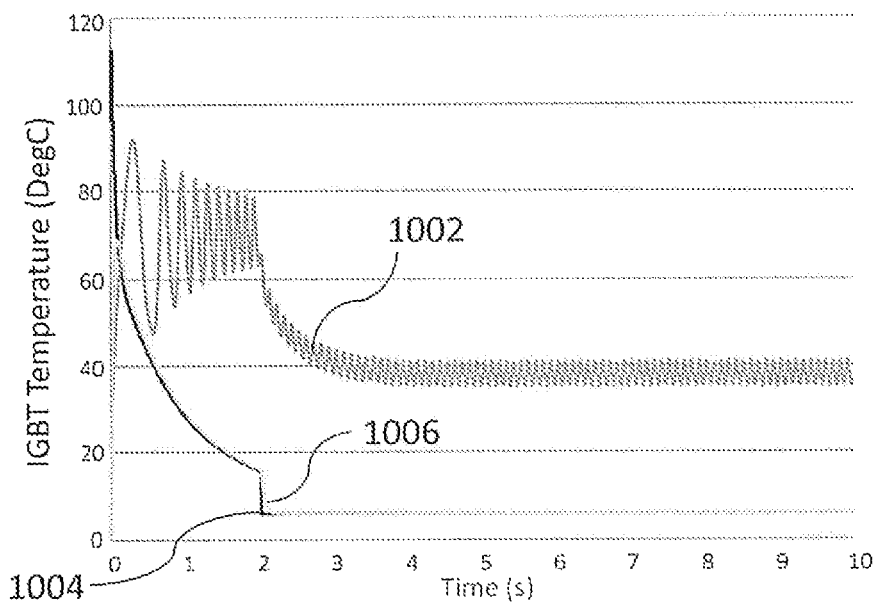
FIG. 10 shows a plot of IGBT temperature vs. time during a slower acceleration of the motor.

The power loss model 202 may estimate power loss within an IGBT based on available measured operating conditions such as motor current magnitude 802 or motor frequency 804 for example. The power loss model 202 may be coupled with a preset or modeled value of the thermal resistance 206 of the IGBT to obtain a simulated peak IGBT temperature, and the simulated peak IGBT temperature may be translated into an IGBT ripple temperature as previously described and shown in FIGS. 9 and 10. The peak IGBT temperature and the IGBT steady-state ripple magnitude are calculated based on the operating conditions being held constant. FIGS. 9 and 10 show plots of IGBT temperature vs. time, based on the profiles of FIGS. 8 (801 and 803, and 802 and 804 respectively). In FIG. 9, IGBT steady-state ripple temperature 904 and the peak IGBT temperature 902 are shown. In FIG. 10, IGBT steady-state ripple temperature 1004 and the peak IGBT temperature 1002 are shown.

In both FIGS. 9 and 10 the IGBT ripple temperature is very high (110 DegC.) when the output frequency is low. In the embodiments described in relation to FIGS. 3 to 7, this high IGBT ripple temperature would result in an immediate reduction in the switching frequency in order to ensure the IGBT ripple temperature falls below the temperature ripple threshold T1. However, due to the thermal time constant of the IGBT, the IGBT ripple temperature never reaches a constant value before the switching frequency is reduced. As a result the switching frequency may be reduced unnecessarily in some instances.

The switching frequency control may be further improved in this instance by applying the value of the IGBT ripple temperature, which is used to reduce the switching frequency, to a filter. FIGS. 9 and 10 show filtered IGBT steady-state ripple temperatures 906 and 1006, after the IGBT steady-state ripple temperatures 904 and 1004 have been applied to a filter. As can be seen, the filtered IGBT steady-state ripple temperatures 906 and 1006 are much closer to the IGBT steady-state temperatures 904 and 1004. Therefore, applying the IGBT ripple temperature to a filter ensures that temperatures closer to the peak IGBT temperature are used to control the switching frequency. This prevents the switching frequency from changing in cases where the IGBT ripple temperature is very high but the IGBT real-time device temperature is not as high due to the thermal time constant of the IGBT. The parameters of the filter can be chosen to match the IGBT characteristics, application requirements and may also be disabled if required.

Figure 11:
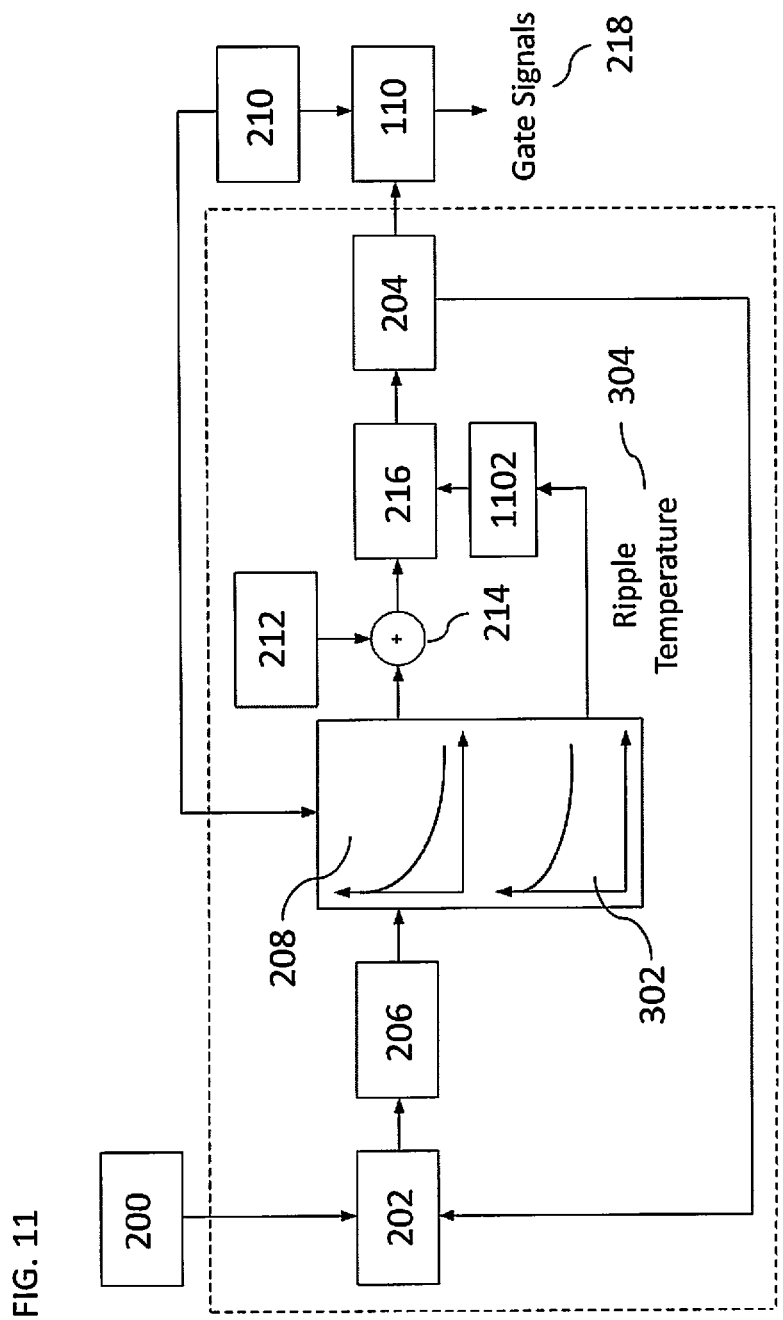
FIG. 11 shows an approach according to an embodiment of the invention in which the value of the IGBT ripple temperature is applied to a filter.

FIG. 11 shows a filter 1102 in the system of FIG. 3. In this embodiment, the IGBT ripple temperature value 304 first passes through the filter 1102 before being sent by the temperature assessment module 216 to the switching frequency control 204 to control the inverter to maintain the filtered ripple temperature below the temperature ripple threshold T1. The filter 1102 may be a system comprising capacitors to smooth the peaks and troughs of the temperature ripple value 304. The filter may instead be a first order filter, which, as the skilled person would understand, may reduce the signal amplitude by half every time the frequency doubles. The filter may be implemented in firmware for example.

Although the embodiments of FIGS. 8 to 11 have been described in relation to one specific component of an inverter, the IGBT, the skilled person would appreciate that the temperature of any component could be monitored instead, including the temperature of the inverter as a whole.

It will be seen, therefore, that the invention described provides an improved operating regime for an inverter in which temperature ripple is maintained below a desired value even if a peak operating temperature is not attained, hence prolonging operation. On the other hand, the switching frequency is maintained at a maximum desired level unless the temperature ripple exceeds a threshold and the peak temperature also exceeds a threshold such that optimal operation is nonetheless achieved. Yet further, by monitoring temperature of individual components, the "hottest component" can be maintained at a preferred operating range hence reducing the risk of individual internal component failure.

It will be appreciated that the approach can be applied to any type of inverter component, using hardware of software control as appropriate and using any means of temperature and temperature ripple computation. The threshold values for peak temperature, peak temperature ripple, maximum and limit switching frequencies and so forth can be preset, modelled, operator input, application or device dependent or selected in any other appropriate manner.

The invention claimed is:

1. A method of controlling a switching frequency of an inverter, the method comprising the steps of:
   measuring a signal indicative of a temperature ripple at a first switching frequency to determine a measured temperature ripple, wherein the measured temperature ripple is determined at a sample rate of a temperature variation monitor;
   comparing the measured temperature ripple to a first threshold;
   determining if the measured temperature ripple is above the first threshold;
   if the measured temperature ripple is not above the first threshold, calculating the temperature ripple at a second switching frequency;
   if the temperature ripple calculated at the second switching frequency is less than the first threshold, setting the switching frequency of the inverter to the second switching frequency.

2. The method of claim 1 wherein the step of comparing the measured temperature ripple comprises comparing the measured temperature ripple to the first threshold and a second threshold, and if the measured temperature ripple is not between the first threshold and the second threshold, the method proceeds to the step of determining if the measured temperature ripple is above the first threshold.

3. The method of claim 2 wherein, if the measured temperature ripple is between the first threshold and the second threshold, the measured temperature ripple is determined again after a predetermined time;
   and optionally wherein the predetermined time is the sample rate of the temperature variation monitor.

4. The method of claim 1 wherein the first threshold is higher than the second threshold.

5. The method of claim 1 wherein the first threshold and the second threshold are such that, if the measured temperature ripple is below the second threshold, the temperature ripple calculated at the second switching frequency is below the first threshold.

6. The method of claim 1 wherein if the measured temperature ripple is above the first threshold, the method further comprises the step of reducing the switching frequency; and optionally wherein reducing the switching frequency comprises reducing the switching frequency to the next lowest switching frequency or to the minimum switching frequency.

7. The method of claim 6 wherein, if the switching frequency is at the minimum switching frequency, the step of reducing the switching frequency comprises keeping the switching frequency at the minimum switching frequency.

8. The method of claim 1 wherein the second switching frequency is higher than the first switching frequency.

9. The method of claim 1 wherein measuring a signal indicative of a temperature ripple comprises measuring a signal indicative of a temperature ripple of the inverter or a signal indicative of a temperature ripple of a component of the inverter; and optionally wherein measuring a signal indicative of a temperature ripple comprises measuring the component of the inverter with the greatest temperature ripple.

10. The method of claim 1 wherein the step of calculating the temperature ripple comprises calculating the temperature online.

11. An inverter controller arranged to carry out the method of claim 1.

12. The inverter controller of claim 11 further comprising the temperature variation monitor.

13. The inverter controller of claim 12 wherein the temperature variation monitor comprises a peak temperature monitor, the inverter controller being arranged to set the switching frequency in response to measured and calculated peak temperatures.

14. The inverter controller of claim 12 wherein the temperature variation monitor comprises a temperature calculation model.

15. The inverter controller of claim 12 wherein the temperature variation monitor comprises a temperature measuring component.

16. The inverter controller of claim 12 wherein the temperature variation monitor is arranged to measure the temperature of a plurality of inverter components.

17. The inverter controller of claim 12 wherein the temperature variation monitor comprises a temperature ripple monitor, the inverter controller being arranged to set the switching frequency in response to measured and calculated ripple temperatures.

18. An inverter including an inverter controller as claimed in claim 11.

19. A motor drive including the inverter as claimed in claim 18.

* * * * *